US011158766B2

(12) United States Patent
Daido et al.

(10) Patent No.: US 11,158,766 B2
(45) Date of Patent: Oct. 26, 2021

(54) LID MATERIAL FOR PACKAGES INCLUDING REFLOWED GOLD-TIN LAYERS, AND METHOD FOR MANUFACTURING PACKAGE

(71) Applicant: MITSUBISHI MATERIALS CORPORATION, Tokyo (JP)

(72) Inventors: Satoru Daido, Sanda (JP); Hironori Uno, Sanda (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 17/260,276

(22) PCT Filed: Oct. 9, 2019

(86) PCT No.: PCT/JP2019/039826
§ 371 (c)(1),
(2) Date: Jan. 14, 2021

(87) PCT Pub. No.: WO2020/080221
PCT Pub. Date: Apr. 23, 2020

(65) Prior Publication Data
US 2021/0249567 A1    Aug. 12, 2021

(30) Foreign Application Priority Data

Oct. 15, 2018 (JP) .............................. JP2018-194535
Oct. 7, 2019 (JP) .............................. JP2019-184287

(51) Int. Cl.
*H01L 33/48* (2010.01)
*H01S 5/02257* (2021.01)
(Continued)

(52) U.S. Cl.
CPC .......... *H01L 33/483* (2013.01); *B23K 1/0016* (2013.01); *B23K 35/3013* (2013.01);
(Continued)

(58) Field of Classification Search
CPC ..... H01L 33/483; C22C 5/02; H01S 5/02257; B23K 1/0016; B23K 35/3013; B23K 2101/40
See application file for complete search history.

(56) References Cited

U.S. PATENT DOCUMENTS

2006/0164631 A1  7/2006  Choi et al.
2013/0050227 A1  2/2013  Petersen et al.
(Continued)

FOREIGN PATENT DOCUMENTS

CN  104517908 A  4/2015
JP  H09-036690 A  2/1997
(Continued)

OTHER PUBLICATIONS

International Search Report dated Dec. 24, 2019, issued for PCT/JP2019/039826 and English translation thereof.
(Continued)

*Primary Examiner* — John P. Dulka
(74) *Attorney, Agent, or Firm* — Locke Lord LLP

(57) ABSTRACT

This lid material for packages is a lid material for packages which is bonded to a package substrate, and the lid material for packages includes: a glass member including a bonding portion provided in a planar frame shape and a light transmitting portion provided inside the bonding portion; one or more metallized layers formed in a frame shape at the bonding portion of the glass member; and one or more Au—Sn layers provided on the metallized layers and having a frame shape having a width of 250 μm or less.

11 Claims, 6 Drawing Sheets

(51) Int. Cl.
*B23K 35/30* (2006.01)
*C22C 5/02* (2006.01)
*B23K 1/00* (2006.01)
*B23K 101/40* (2006.01)

(52) U.S. Cl.
CPC ............ *C22C 5/02* (2013.01); *H01S 5/02257* (2021.01); *B23K 2101/40* (2018.08)

(56) References Cited

U.S. PATENT DOCUMENTS

| | | | |
|---|---|---|---|
| 2014/0319982 A1 | 10/2014 | Yamamoto et al. | |
| 2015/0014711 A1 | 1/2015 | Bergenek et al. | |
| 2016/0122183 A1* | 5/2016 | Kapusta ............. | B23K 35/3013 228/175 |
| 2016/0126195 A1* | 5/2016 | Kapusta ................ | B81B 7/0077 257/414 |

FOREIGN PATENT DOCUMENTS

| | | |
|---|---|---|
| JP | 2004-253638 A | 9/2004 |
| JP | 2008-147234 A | 6/2008 |
| JP | 2011-040577 A | 2/2011 |
| JP | 5373262 B2 | 12/2013 |
| JP | 2015-018873 A | 1/2015 |
| JP | 2015-122413 A | 7/2015 |
| JP | 6260919 B2 | 1/2018 |
| JP | 6294417 B2 | 3/2018 |
| JP | 2018-152385 A | 9/2018 |

OTHER PUBLICATIONS

Office Action dated Mar. 24, 2020, issued for Japanese Patent Application No. 2019-184287 and English translation thereof.
Office Action dated Aug. 4, 2020, issued for Japanese Patent Application No. 2019-184287 and English translation thereof.
Office Action dated May 1, 2021, issued for Korean Patent Application No. 10-2020-7035590 and English translation thereof.
Supplementary European Patent Office dated Jul. 27, 2021, issued for European patent application No. 19872989.9.
Office Action dated Aug. 4, 2021, issued for Chinese Patent Application No. 201980059130.3 and English translation thereof.

* cited by examiner

LID MATERIAL FOR PACKAGES INCLUDING REFLOWED GOLD-TIN LAYERS, AND METHOD FOR MANUFACTURING PACKAGE

TECHNICAL FIELD

The present invention relates to a lid material for packages which is bonded to a package substrate, and a package.

The present application claims priority on Japanese Patent Application No. 2018-194535 filed on Oct. 15, 2018 and Japanese Patent Application No. 2019-184287 filed on Oct. 7, 2019, and the contents of which are incorporated herein by reference.

BACKGROUND ART

In the related art, semiconductor devices and light emitting devices are known which are sealed in packages in order to protect light emitting elements such as semiconductor lasers (LDs) and LEDs from the external environment (refer to, for example, Patent Documents 1 and 2).

The semiconductor device described in Patent Document 1 includes: a package substrate having a recess in which an upper portion is open; an optical semiconductor element accommodated in the recess; a window member (lid material for packages) arranged so as to cover the opening of the recess; and a sealing structure which seals between the package substrate and the window member. This sealing structure includes: a first metal layer provided in a frame shape on the upper surface of the package substrate; a second metal layer provided in a frame shape on the inner surface of the window member; and a metal bonding portion provided between the first metal layer and the second metal layer, and in the region in which one of the first metal layer and the second metal layer is provided, the entirety of the other of the first metal layer and the second metal layer is positioned therein.

The light emitting device described in Patent Document 2 includes: a mounting substrate; an ultraviolet light emitting element mounted on the mounting substrate; and a cap (lid material for packages) in which a recess is formed to be arranged on the mounting substrate, and the ultraviolet light emitting element is accommodated in the recess. The mounting substrate includes a support, a first conductor portion, a second conductor portion, and a first bonding metal layer, which are supported by the support. The cap includes: a cap body in which a recess is formed on the back surface; and a second bonding metal layer arranged at the peripheral portion of the recess so as to oppose the first bonding metal layer. The uppermost layer, which is the farthest from the support, in each of the first conductor portion, the second conductor portion, and the first bonding metal layer is formed of Au, and the first bonding metal layer and the second bonding metal layer are bonded by Au—Sn.

The metal bonding portion described in Patent Document 1 consists of an Au—Sn alloy. Also, in Patent Document 2, the first bonding metal layer and the second bonding metal layer are bonded by an Au—Sn alloy. That is, in all of the configurations of Patent Document 1 and 2, an Au—Sn layer consisting of an Au—Sn alloy is formed on the lid material for packages. The Au—Sn layer is formed, for example, by coating an Au—Sn paste on the part described above and subjecting the Au—Sn paste to reflowing.

In the case where the Au—Sn paste is coated on a glass plate material and then is subjected to reflowing, the Au—Sn layer may be peeled off from the glass plate material or a part of the glass plate material may be peeled off, and there is a concern that the lid material for packages may be damaged.

PRIOR ART DOCUMENTS

Patent Document

Patent Document 1: Japanese Patent No. 6294417
Patent Document 2: Japanese Patent No. 6260919

DISCLOSURE OF INVENTION

Problems to be Solved by the Invention

The present invention was made in view of such circumstances, and the present invention aims to provide a lid material for packages and a package capable of suppressing an Au—Sn layer from being peeled off and suppressing damage to the lid material for packages.

Solutions for Solving the Problems

The lid material for packages according to one aspect of the present invention is a lid material for packages which is bonded to a package substrate, the lid material includes: a glass member including a bonding portion provided in a planar frame shape and a light transmitting portion provided inside the bonding portion; one or more metallized layers formed in a frame shape at the bonding portion of the glass member; and one or more Au—Sn layers provided on the metallized layers and having a frame shape having a width of 250 μm or less.

The coefficient of linear expansion of the Au—Sn layer is different from the coefficient of linear expansion of the glass member. In the case where the Au—Sn layer is formed by reflowing, the shrinkage ratio of the Au—Sn layer during cooling is larger than the shrinkage ratio of the glass member. Due to this, the stress based on the shrinkage of the Au—Sn layer during cooling acts on the glass member; and thereby, the Au—Sn layer may be peeled off from the glass member or a part of the glass member may be peeled off.

On the other hand, since the width of the Au—Sn layer is 250 μm or less, the stress on the glass member due to the shrinkage of the Au—Sn layer is small; and as a result, it is possible to suppress peeling off and damage of the glass member (to suppress the glass member from being peeled off and being damaged) due to the shrinkage of the Au—Sn layer.

In a preferable aspect of the lid material for packages of the present invention, the frame shape of the one or more Au—Sn layers may have one or more corner portions, and a maximum width of the corner portion may be smaller than the width of the frame shape in a part excluding the corner portions of the Au—Sn layer.

The maximum width of the corner portion means the maximum dimension in the direction intersecting the circumferential direction of the frame shape. In the aspect described above, since the maximum width of the corner portion is smaller than the width of the part excluding the corner portions, it is possible to reliably reduce the stress in the glass member at the corner portions.

In a preferable aspect of the lid material for packages of the present invention, the corner portion may be chamfered.

For example, in the case where the frame shape of the Au—Sn layer is rectangular, the two straight portions intersect at 90° at the corner portion, the maximum width at the four corner portions is larger than the width of the portions other than the corner portions, and stress due to the shrinkage of the Au—Sn layer during cooling tends to be concentrated thereon. On the other hand, in the case where the corner portions are chamfered such that the maximum width of the corner portion is smaller than the width of the part excluding the corner portions, it is possible to further reduce stress on the glass member.

In a preferable aspect of the lid material for packages of the present invention, the one or more Au—Sn layers may be a first Au—Sn layer and a second Au—Sn layer provided inside the first Au—Sn layer with a gap therebetween.

In the aspect described above, since the Au—Sn layers are the first Au—Sn layer and the second Au—Sn layer, it is possible to increase the bonding strength when the lid material for packages is bonded to the package substrate. Furthermore, since the second Au—Sn layer is provided inside the first Au—Sn layer with a gap therebetween and the width of the first Au—Sn layer and the width of the second Au—Sn layer are both 250 μm or less, the stress on the glass member due to the shrinkage of the Au—Sn layer is small and it is possible to suppress peeling off of the Au—Sn layer from the glass member and it is possible to suppress damage of the lid material for packages.

In a preferable aspect of the lid material for packages of the present invention, a thickness of the glass member may be 50 μm or more and 3000 μm or less.

The width of the Au—Sn layer may be 50 μm or more.
The width of the Au—Sn layer may be 230 μm or less.
The maximum width of the corner portion may be 30 μm or more and 130 μm or less.
The glass member may have a flat plate shape.
The glass member may have a box shape.

A package according to one aspect of the present invention includes: at least one or more package substrates; and the lid material for packages according to one aspect of the present invention, wherein the lid material for packages and the package substrate are bonded by a bonding layer formed by melting and solidifying the Au—Sn layer.

In the package according to one aspect of the present invention, the package substrate and the lid material for packages are reliably bonded and it is possible to suppress peeling off and damage of the package substrate by stress (to suppress the package substrate from being peeled off and being damaged by stress) due to shrinkage of the Au—Sn layer.

Effects of Invention

In one aspect of the present invention, it is possible to suppress peeling off of the Au—Sn layer formed on the glass member and it is possible to suppress damage of the lid material for packages.

EMBODIMENTS FOR CARRYING OUT THE INVENTION

Figure 1:
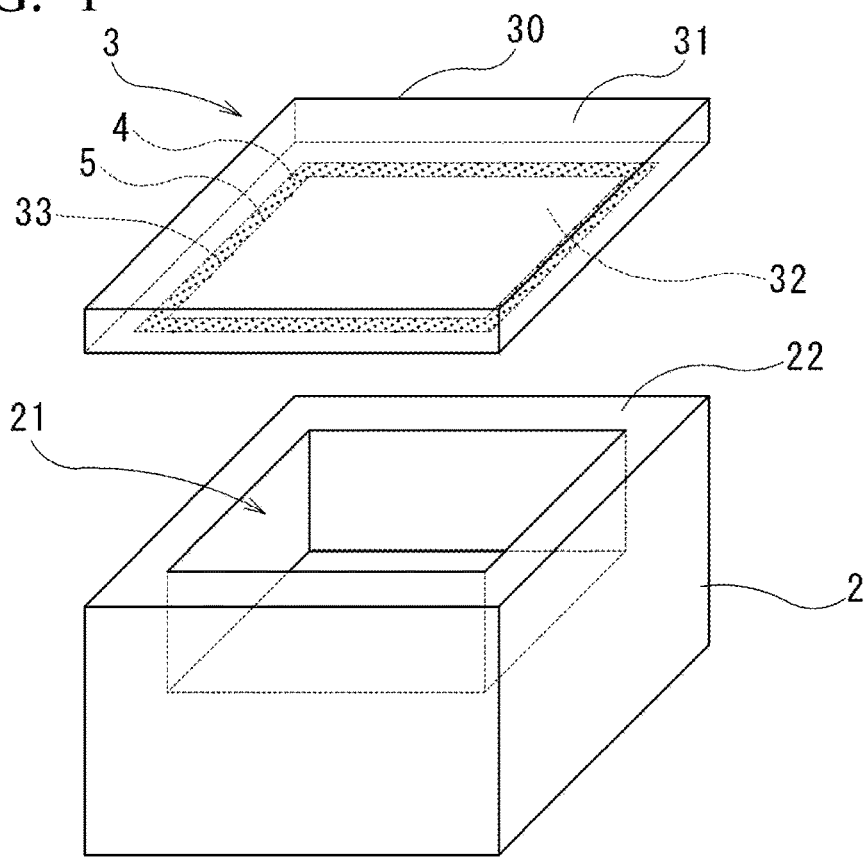
FIG. 1 is a perspective view showing a lid material for packages and a package substrate forming the package according to the first embodiment.
Figure 2:
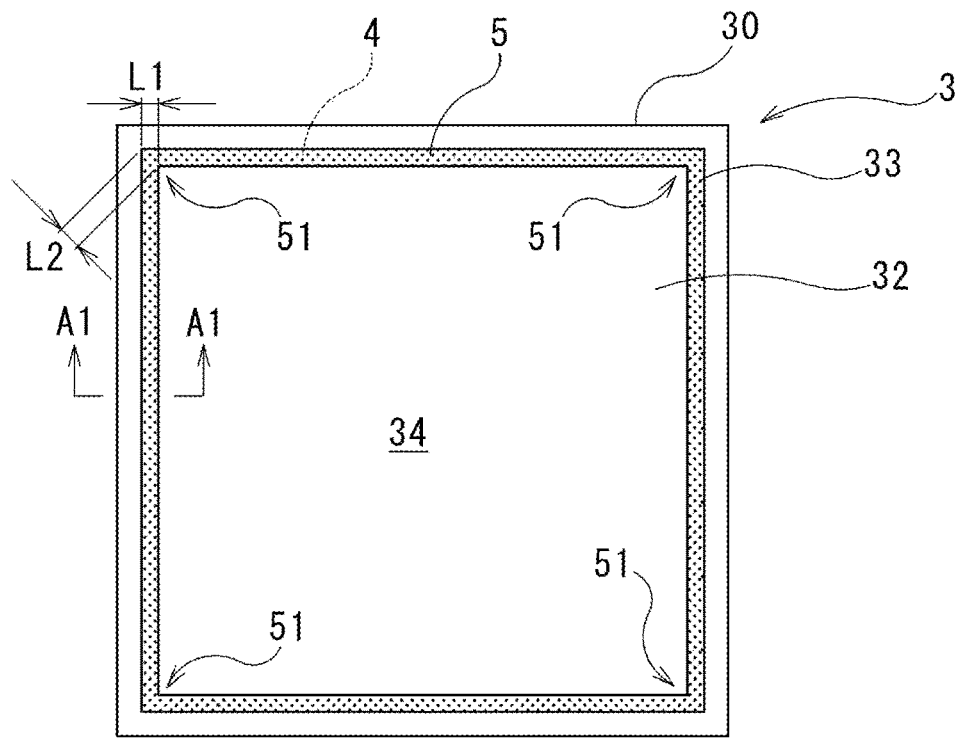
FIG. 2 is a plan view showing a surface to be bonded to a package substrate, in the lid material for packages of the first embodiment.
Figure 3:
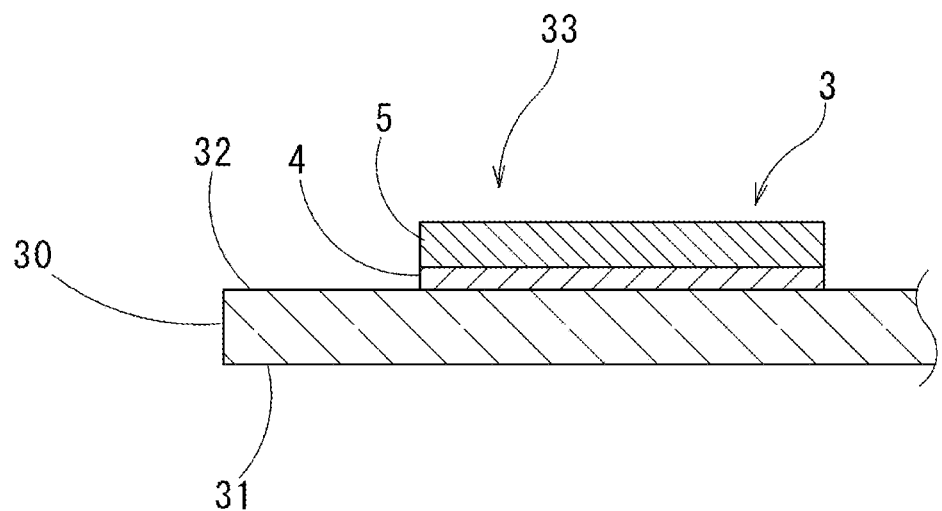
FIG. 3 is a cross-sectional view of the lid material for packages taken along an A1—A1 arrow line shown in FIG. 2.
Figure 9:
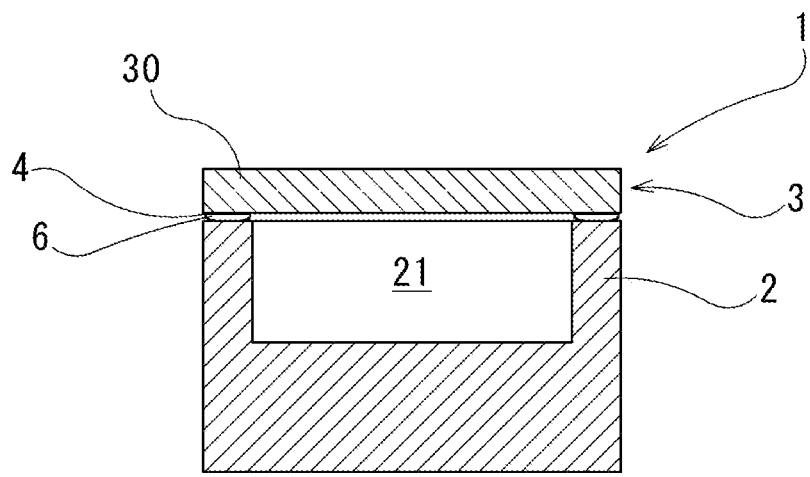
FIG. 9 is a cross-sectional view showing a package according to the first embodiment.

A description will be given below of each embodiment of the lid material for packages and the package according to the present invention with reference to the drawings. FIG. 1 is a perspective view showing a package substrate 2 and a lid material for packages 3 of the present embodiment. FIG. 2 is a plan view of the lid material for packages 3. FIG. 3 is a cross-sectional view taken along an A1—A1 arrow line of FIG. 2 for the lid material for packages 3. FIG. 9 is a cross-sectional view of a package 1 formed by bonding the package substrate 2 and the lid material for packages 3.

[Outline Structure of Package]

As shown in FIG. 1 and FIG. 9, the package 1 includes the package substrate 2 including a recess 21 having an open upper portion, and a flat plate-shaped lid material for packages 3 which is bonded to the package substrate 2 to close the recess 21. A light emitting element (not shown) such as a laser diode (LD), a light emitting diode (LED) or the like is accommodated in the package 1.

[Configuration of Package Substrate]

As shown in FIG. 1 and FIG. 9, the package substrate 2 includes the recess 21 having an open upper portion and a bonding surface 22 provided on the periphery of the recess 21. For example, the package substrate 2 is formed in a rectangular box shape using aluminum nitride (AlN) or the like. The recess 21 is closed by bonding the lid material for packages 3 to the bonding surface 22; and thereby, the recess 21 forms a space for accommodating a light emitting element or the like.

[Configuration of Lid Material for Packages]

As shown in FIG. 1 to FIG. 3, the lid material for packages 3 includes: a rectangular plate-shaped glass member 30 including a bonding portion 33 provided in a planar frame shape and a light transmitting portion 34 provided inside the bonding portion 33; a metallized layer 4 formed in a frame shape on the bonding portion 33, and a frame-shaped Au—Sn layer 5 formed on the metallized layer 4.

The bonding portion 33 may also be described as a frame line surrounding the periphery of the light transmitting portion 34 including the approximately central portion of the glass member 30. The bonding portion 33 determines the contours and region of the light transmitting portion 34. The metallized layer 4 and the Au—Sn layer 5 may also be described as frame lines surrounding the periphery of the light transmitting portion 34. The bonding portion 33, the metallized layer 4, and the Au—Sn layer 5 may also be described as having a frame shape.

The glass member 30 includes an upper surface 31 which is the top surface of the package 1, and a lower surface 32 including the bonding portion 33 which is bonded to the bonding surface 22 of the package substrate 2. For example, the glass member 30 is formed in the shape of a rectangular plate having sides of 2 mm to 30 mm and a thickness of 50 µm to 3000 µm using borosilicate glass, quartz glass, or the like.

As shown in FIG. 1 to FIG. 3, the rectangular frame-shaped metallized layer 4 consisting of Au, Ti, Ni, or the like is formed on the bonding portion 33 of the lower surface 32. The Au—Sn layer 5 having the same rectangular frame shape as the metallized layer 4 is formed on the metallized layer 4.

The metallized layer 4 is larger than the recess 21 of the package substrate 2 and is formed so as to surround the recess 21 and be in contact with the bonding surface 22. The width of the Au—Sn layer 5 is the same as the width of the metallized layer 4 or narrower than the width of the metallized layer 4, and is set to be 250 µm or less.

That is, the region surrounded by the frame (frame line) of the metallized layer 4 is larger than the opening region at the upper portion of the recess 21 of the package substrate 2. The line width of the frame (frame line) of the Au—Sn layer 5 is the same as the line width of the frame (frame line) of the metallized layer 4, or narrower than the line width of the frame (frame line) of the metallized layer 4. In the present embodiment, the line width of the Au—Sn layer 5 is set to be 250 µm or less.

Specifically, as shown in FIG. 2, in the Au—Sn layer 5, at the corner portions 51, the two sides of the rectangle intersect at 90° and a maximum width (maximum line width) L2 at the four corner portions 51 (the distance between the intersection of the two outer sides and the intersection of the two inner sides in the contours of the Au—Sn layer 5, that is, the maximum dimension in the direction intersecting the circumferential direction of the frame shape) is larger than a width (line width) L1 of a part excluding the four corner portions 51.

However, the width L1 and the maximum width L2 are both 250 µm or less. In the case where the width L1 and the maximum width L2 exceed 250 µm, during cooling after the reflowing which melts the Au—Sn layer 5, stress due to the difference in the coefficient of linear expansion between the Au—Sn layer 5 and the glass member may increase, the Au—Sn layer 5 may be peeled off from the glass member, or the glass member may be damaged.

In addition, the width L1 and the maximum width L2 are preferably 50 µm or more. In such a case, in the package 1 in which the lid material for packages 3 and the package substrate 2 are bonded, the bonding between the lid material for packages 3 and the package substrate 2 becomes strong, thus, the lid material for packages 3 does not come off from the package substrate 2.

More preferably, the width L1 of the part (straight portion) of the Au—Sn layer 5 excluding the corner portion 51 may be set to be 50 µm or more and 230 µm or less, and the maximum width L2 of the four corner portions 51 may be set to be 70 µm or more and 250 µm or less.

The height (thickness) of the Au—Sn layer 5 is preferably set to be, for example, 1 µm or more and 100 µm or less.

A light emitting element is accommodated in the recess 21 of the package substrate 2 described above. Next, the Au—Sn layer 5 on the lower surface 32 of the lid material for packages 3 is brought into contact on the bonding surface 22 of the package substrate 2. The package substrate 2 and the lid material for packages 3 are reflowed (heated) in a state where the Au—Sn layer 5 is in contact with the bonding surface 22. Due to this, Au—Sn solder (a bonding layer 6) formed by melting the Au—Sn layer 5 is formed. The package substrate 2 and the lid material for packages 3 are bonded by this Au—Sn solder (the bonding layer 6), and the package 1 is formed as shown in FIG. 9.

[Method for Manufacturing Lid Material for Packages]

The lid material for packages 3 is manufactured as follows, for example. A plurality of metallized layers 4 (for example, 25 square frames in which the outer shape is 3 mm in length and width) consisting of Au, Ti, Ni, or the like are formed on the surface of one glass member 30 (in the present embodiment, a plate material having a size of 20 mm×20 mm) by sputtering, plating, or the like. Next, Au—Sn paste is coated so as to form a rectangular frame (for example, 25 square frames in which the outer shape is 3 mm in length and width) on each metallized layer 4.

That is, a plurality of the metallized layers 4 having a rectangular (square) frame shape are formed on the surface of the glass member 30. Next, an Au—Sn layer having a rectangular (square) frame shape is formed on each metallized layer 4. The Au—Sn layer is formed by coating Au—Sn paste.

The metallized layer 4 is preferably formed by Au plating. The metallized layer 4 is formed in the same rectangular frame shape as the Au—Sn layer 5.

The Au—Sn paste forming the Au—Sn layer 5 is, for example, formed by mixing an Au—Sn alloy powder and a flux such that the ratio of the amount of the flux (flux ratio) is 10% by mass or more and 90% by mass or less when the amount of the Au—Sn paste is 100% by mass. The Au—Sn alloy powder contains, for example, Sn in an amount of 21% by mass or more and 23% by mass or less with the remainder being Au and unavoidable impurities. The flux is not particularly limited, but it is possible to use a general flux for solder. For example, it is possible to use an RA type, an RMA type, a non-halogen type flux, an MSN type, an AS1 type, an AS2 type, or the like.

Au—Sn paste is printed and coated on the metallized layer 4 so as to form a coating film having a width of 50 µm or more and 250 µm or less and a thickness of 1 µm or more and 100 µm or less. The Au—Sn paste may be coated by being discharged and supplied with a dispenser or the like.

Next, the glass member 30 on which the Au—Sn paste is printed and coated is heated (reflowed). In this reflow step, the coated film of the Au—Sn paste is, for example, heated in a non-oxidizing atmosphere such as an N2 atmosphere or the like. The heating temperature may be in a range of 280° C. to 350° C., preferably in a range of 280° C. to 330° C., and more preferably in a range of 280° C. to 300° C. With regard to the heating time, the coated film may be maintained at the heating temperature for 10 seconds to 120 seconds. The heating time is preferably in a range of 20 seconds to 90 seconds, and more preferably in a range of 30 seconds to 60 seconds. An example of a suitable condition is a condition of heating at 300° C. for one minute.

Due to this, the Au—Sn paste melts. The molten Au—Sn stays on the metallized layer 4 and is cooled in that state to form the Au—Sn layer 5 having the same width as the metallized layer 4. Since the formed Au—Sn layer 5 incorporates the metallized layer 4, the composition is slightly different from that of the Au—Sn paste and consists of an Au—Sn alloy having a composition consisting of 19 wt % to 23 wt % of Sn and the remainder of Au and unavoidable impurities.

The coefficient of linear expansion of the Au—Sn layer 5 formed by reflowing is different from the coefficient of linear expansion of the glass member 30. That is, the shrinkage ratio of the Au—Sn layer 5 due to cooling is larger than the shrinkage ratio of the glass member. From this, in the case where the stress acting on the glass member 30 due to the shrinkage of the Au—Sn layer 5 during cooling is large, there is a fear that the Au—Sn layer 5 may be peeled off from the glass member 30 or a part of the glass member 30 may be peeled off.

On the other hand, in the present embodiment, since the width of the Au—Sn layer 5 is 250 μm or less, the stress acting on the glass member 30 due to the shrinkage of the Au—Sn layer 5 during cooling is small. Due to this, it is possible to suppress peeling off of the Au—Sn layer 5 from the glass member 30 or it is possible to suppress damage of the glass member 30.

The glass member 30 in which the plurality of rectangular Au—Sn layers 5 are formed is divided at each Au—Sn layer 5; and thereby, the lid material for packages 3 shown in FIGS. 2 to 3 is obtained. The lid material for packages 3 manufactured in this manner is bonded to the package substrate 2 as described above to form the package 1.

By using the lid material for packages 3, the recess 21 of the package substrate 2 is reliably sealed by the lid material for packages 3 and it is possible to suppress peeling off of and damage of the package substrate 2 by stress (to suppress the package substrate 2 from being peeled off and being damaged by stress) due to the shrinkage of the Au—Sn layer 5.

FIG. 9 shows the package 1. The Au—Sn layer 5 melts and then solidifies to form the bonding layer 6. In the package 1, the lid material for packages 3 is bonded to the package substrate 2 without a gap by the bonding layer 6.

The present invention is not limited to the embodiment described above and it is possible to make various modifications thereto without departing from the features of the present invention. A description will be given below of the second embodiment to the eighth embodiment, but description of the same features as those of the first embodiment will be omitted. In addition, the width of the metallized layer and the Au—Sn layer is the line width of the frame (frame line) or the frame shape.

Figure 4:
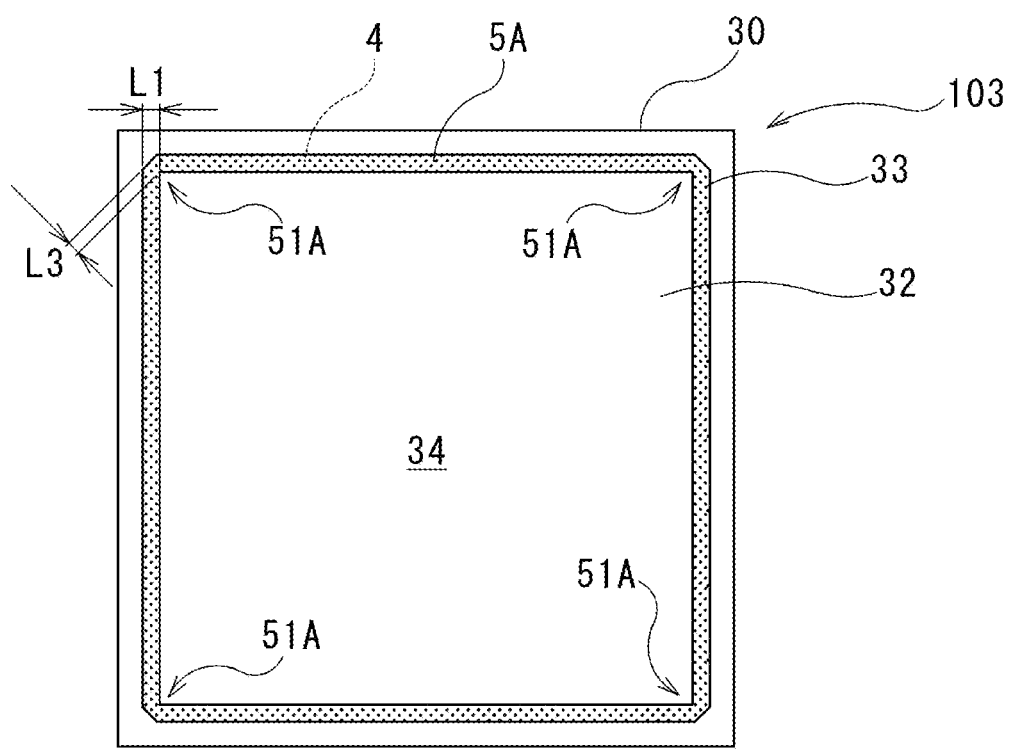
FIG. 4 is a plan view showing a surface to be bonded to a package substrate, in the lid material for packages of a second embodiment.

FIG. 4 is a plan view showing a lid material for packages 103 according to the second embodiment. In the second embodiment, an Au—Sn layer 5A is provided instead of the Au—Sn layer 5. In the Au—Sn layer 5A, each of rectangular frame-shaped corner portions 51A is chamfered. Therefore, a maximum width L3 of the four corner portions 51A (the maximum dimension in the direction intersecting the circumferential direction at the corner portions of the frame forming the Au—Sn layer 5A) is smaller than the width L1 of the part excluding the four corner portions 51A. That is, the width of any part of the Au—Sn layer 5A is 250 μm or less.

For example, in the Au—Sn layer 5A, the width L1 of the part (straight portion) excluding the corner portions 51A is set to be 50 μm or more and 250 μm or less, and the maximum width L3 of the four corner portions 51A is set to be 30 μm or more and 130 μm or less. The Au—Sn layer 5A having such a shape may be formed by the following method.

The metallized layer 4 in which corner portions are chamfered may be formed with the same shape as the Au—Sn layer 5A, the Au—Sn paste may be coated thereon in the same shape in which corner portions are chamfered, and then the Au—Sn paste may be reflowed; and thereby, the Au—Sn layer 5A may be formed. In addition, an Au—Sn layer may be formed in a rectangular frame shape without chamfering in the same manner on the metallized layer 4 formed in a rectangular frame shape without chamfering, and then the corner portions 51A of the Au—Sn layer may be chamfered; and thereby, the Au—Sn layer 5A may be formed.

Stress easily concentrates on the corner portions 51A of the Au—Sn layer 5A due to the shrinkage of the Au—Sn layer 5A during cooling. In the second embodiment, since the corner portions 51A of the Au—Sn layer 5A where the stress due to the shrinkage of the Au—Sn layer 5A during cooling easily concentrates are chamfered, it is possible to further reduce the stress on the lid material for packages 103. In addition, since the maximum width L3 of the corner portion 51A in the Au—Sn layer 5A is smaller than the width L1 of the part of the Au—Sn layer 5A excluding the corner portions 51A, it is possible to reliably reduce the stress on the lid material for packages 3 in the corner portions 51A.

Figure 5:
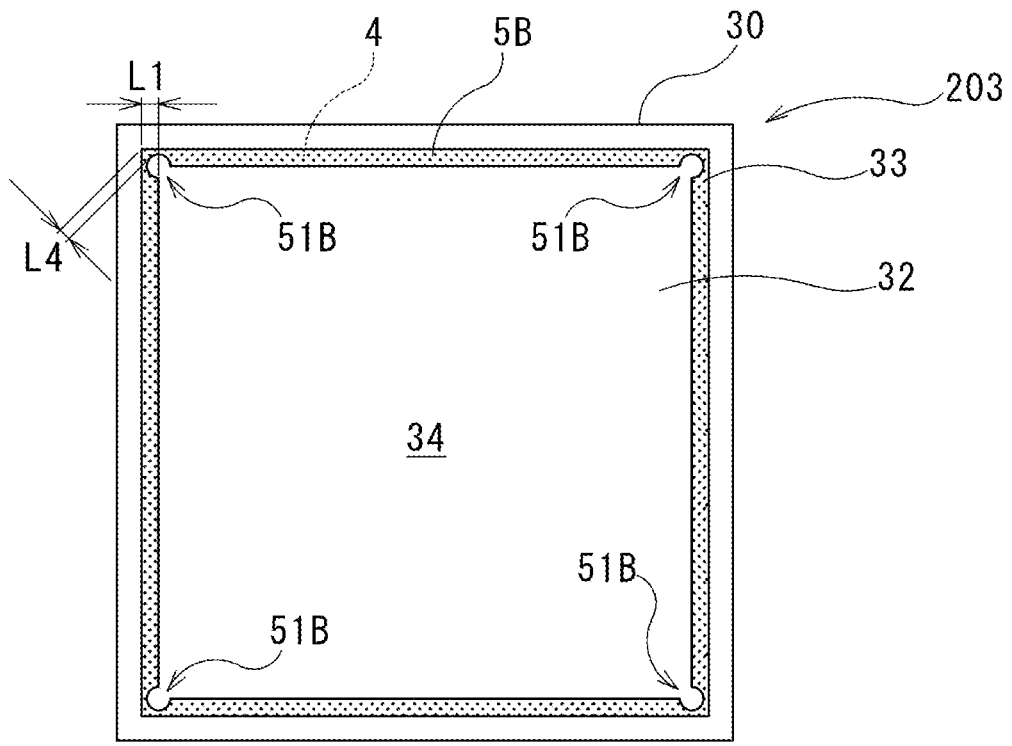
FIG. 5 is a plan view showing a surface to be bonded to the package substrate, in the lid material for packages of a third embodiment.

FIG. 5 is a plan view showing a lid material for packages 203 according to the third embodiment. In the third embodiment, an Au—Sn layer 5B is provided instead of the Au—Sn layer 5. The Au—Sn layer 5B has a shape in which four corner portions 51B having a rectangular frame shape are notched in a circular shape on the inside. Therefore, a maximum width L4 of the four corner portions 51B is smaller than the width L1 of the part excluding the four corner portions 51B. That is, the width of any part of the Au—Sn layer 5B is also 250 μm or less.

For example, the width L1 of the part (straight portion) of the Au—Sn layer 5B excluding the corner portions 51B is set to be 50 μm or more and 230 μm or less, and the maximum width L4 of the four corner portions 51B is set to be 30 μm or more and 130 μm or less.

The Au—Sn layer 5B having such a shape may be formed by the following method. The metallized layer 4 including notches having the same shape as those of the Au—Sn layer 5B may be formed, Au—Sn paste may be coated thereon in a shape including the same notches and then the Au—Sn paste may be reflowed; and thereby, the Au—Sn layer 5B may be formed. In addition, an Au—Sn layer may be formed in a rectangular frame shape without a notch in the same manner on the metallized layer 4 formed in a rectangular frame shape without a notch, and then the inside of the corner portion 51B of the Au—Sn layer may be notched into a circular shape; and thereby, the Au—Sn layer 5B may be formed.

Figure 6:
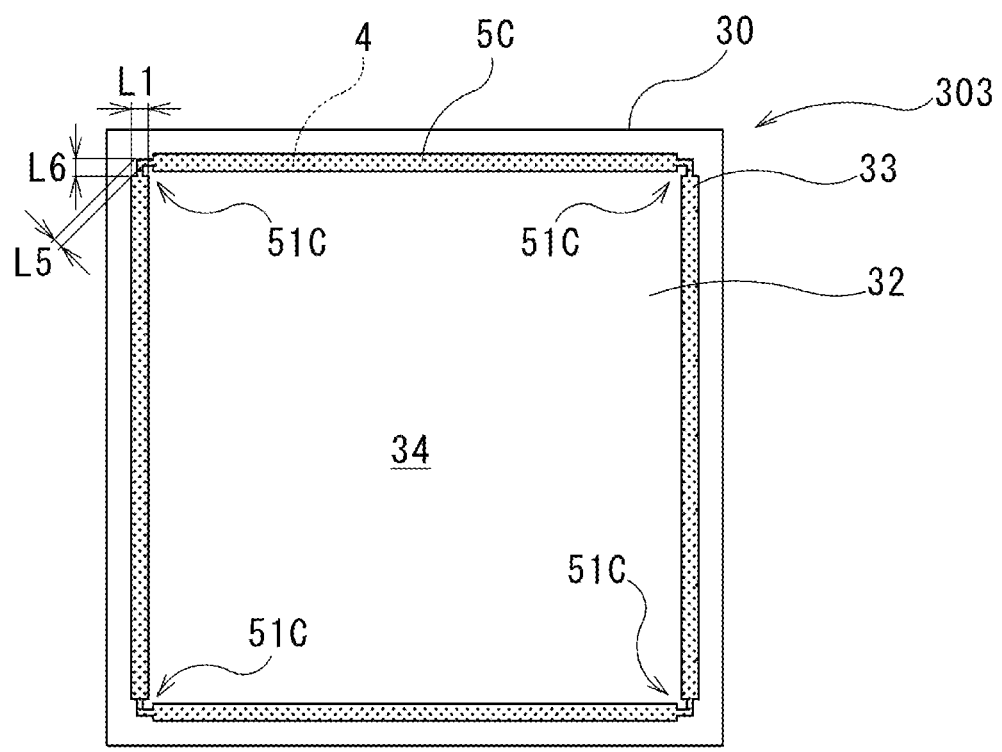
FIG. 6 is a plan view showing a surface to be bonded to the package substrate, in the lid material for packages of a fourth embodiment.

FIG. 6 is a plan view showing the lid material for packages 303 according to the fourth embodiment. In the fourth embodiment, an Au—Sn layer 5C is provided instead of the Au—Sn layer 5. In the Au—Sn layer 5C, a maximum width L5 of the two sides intersecting at a corner portion 51C is approximately half the width of the width L1 of the part (straight portion) excluding the corner portion 51C of the Au—Sn layer 5C. Therefore, on the two sides intersecting at the corner portion 51C, a region (part) in which the width is approximately half of the width L1 of the straight portion is provided. A distance L6 of the region where the width is approximately half of the width L1 of the straight portion on one of the two sides intersecting at the corner portion 51C is set to be 40 μm or more and 125 μm or less in consideration of a decrease in the bonding property.

Therefore, the maximum width L5 of the four corner portions 51C of the Au—Sn layer 5C is smaller than the width L1 of the straight portion of the Au—Sn layer 5C. That is, the width of any part of the Au—Sn layer 5C is 250 μm or less.

For example, in the Au—Sn layer 5C, the width L1 of the straight portion is set to be 50 μm or more and 250 μm or less, and the maximum width L5 of the four corner portions 51C is set to be 30 μm or more and 130 μm or less.

Figure 7:
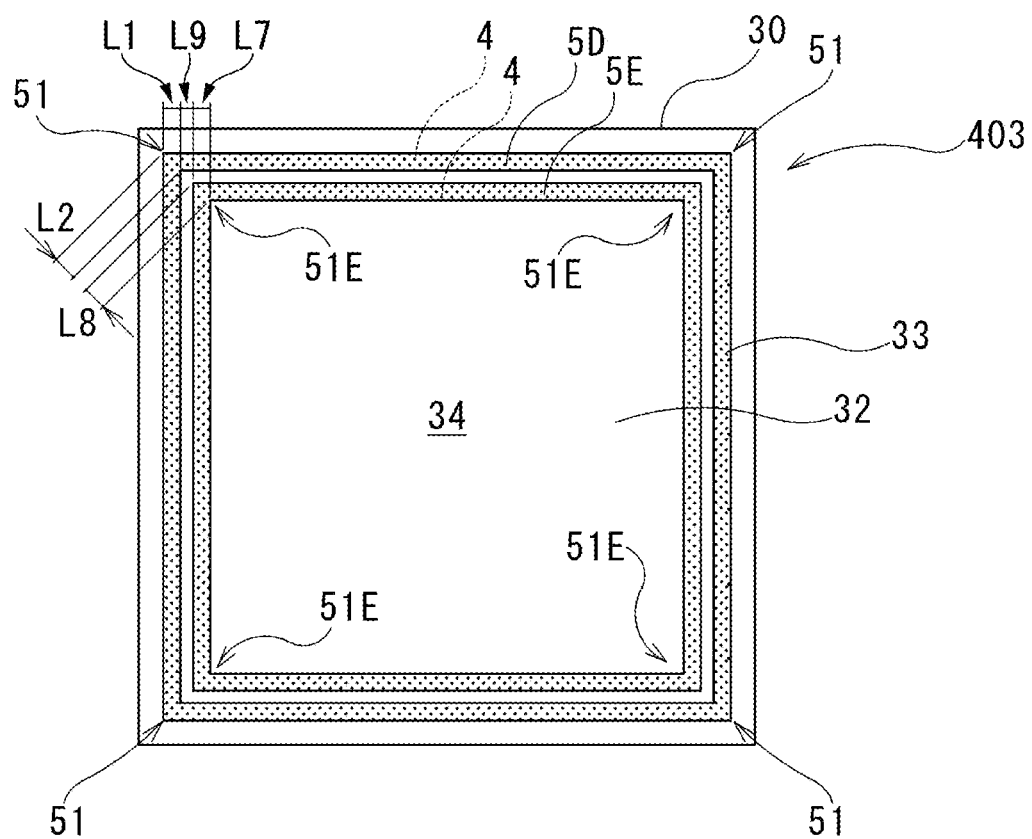
FIG. 7 is a plan view showing a surface to be bonded to the package substrate, in the lid material for packages of a fifth embodiment.

FIG. 7 is a plan view showing a lid material for packages 403 according to the fifth embodiment. In the fifth embodiment, instead of the Au—Sn layer 5, there are a frame-shaped first Au—Sn layer 5D and a frame-shaped second Au—Sn layer 5E formed inside the first Au—Sn layer 5D with a gap therebetween. The width L1 of the first Au—Sn layer 5D, the maximum width (maximum line width) L2 at the corner portion 51, the width L7 of the second Au—Sn layer 5E, and the maximum width (maximum line width) L8 at the corner portion 51E are set to be 250 μm or less.

The first Au—Sn layer 5D is the same as the Au—Sn layer 5 of the first embodiment. In the second Au—Sn layer 5E, the width L7 of the straight portion is set to be 50 μm or more and 250 μm or less, and the maximum width L8 of the four corner portions 51E is set to be 70 μm or more and 250 μm or less. A distance L9 of a gap between the first Au—Sn layer 5D and the second Au—Sn layer 5E is set to be 10 μm or more and 500 μm or less.

By setting the gap distance L9 to be in the range described above, it is possible to suppress peeling off of the Au—Sn layers 5D and 5E from the lid material for packages 403 due to the shrinkage of the melted Au—Sn during the manufacturing of the respective Au—Sn layers 5D and 5E. In the fifth embodiment in which the Au—Sn layers 5D and 5E are formed as two layers, it is possible to expand the bonding range according to the Au—Sn layers more than those in the lid materials for packages of the first to fourth embodiments, thus, it is possible to increase the bonding strength when the package substrate 2 is sealed by the lid material for packages 403.

In each of the embodiments described above, each Au—Sn layer is formed in a rectangular frame shape, but the present invention is not limited thereto. For example, the frame-shaped Au—Sn layer may have a triangular shape or a hexagonal shape, or may have a circular shape without corner portions.

Figure 8:
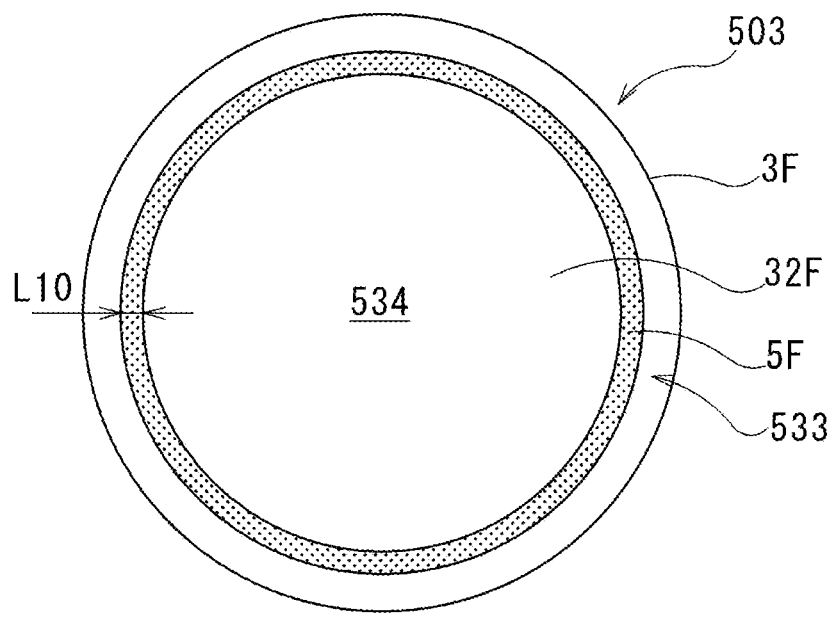
FIG. 8 is a plan view showing a surface to be bonded to the package substrate, in the lid material for packages of a sixth embodiment.

FIG. 8 is a plan view showing a lid material for packages 503 according to the sixth embodiment. In the sixth embodiment, the lid material for packages 503 includes a circular-shaped glass member 3F instead of the rectangular glass member 30, and a circular frame-shaped metallized layer (not shown) and a circular frame-shaped Au—Sn layer 5F instead of the rectangular frame-shaped metallized layer 4 and the Au—Sn layer 5. The glass member 3F includes a central light transmitting portion 534 and a circular frame-shaped bonding portion 533 surrounding the light transmitting portion 534. On the lower surface 32F of the glass member 3F, the Au—Sn layer 5F is formed in a circular shape with no corner portions in the bonding portion 533. A width L10 of the Au—Sn layer 5F is 250 μm or less. For example, the width L10 of the Au—Sn layer 5F is set to be 50 μm or more and 250 μm or less.

Figure 10:
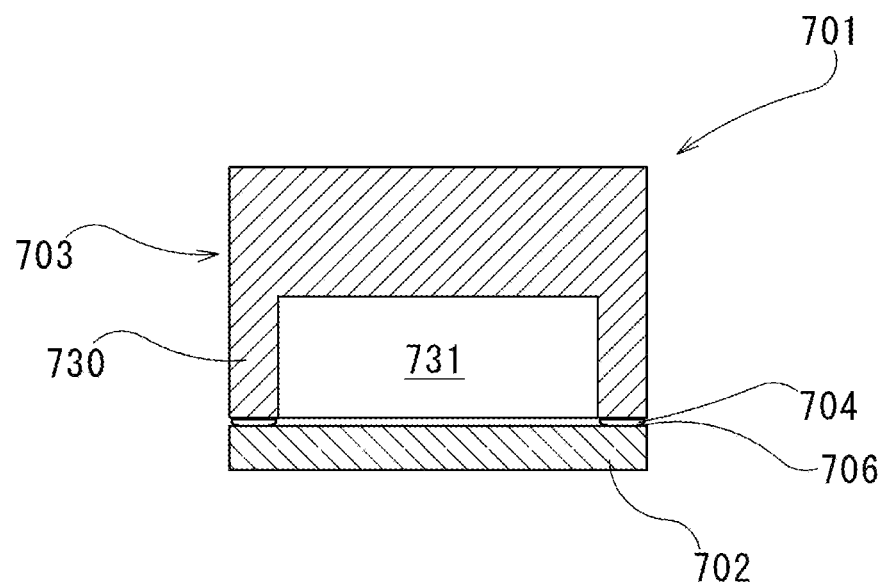
FIG. 10 is a cross-sectional view showing a package according to a seventh embodiment.

FIG. 10 is a cross-sectional view showing a package 701 according to the seventh embodiment. In the package 701, a recess 731 is provided not in a package substrate 702 but in a glass member 730 of the lid material for packages 703. The lid material for packages 703 includes the glass member 730, the frame-shaped metallized layer 704 formed on the glass member 730, and a frame-shaped Au—Sn layer formed on the metallized layer 704. The lid material for packages 703 is bonded to the flat plate-shaped package substrate 702 by a bonding layer 706 which is formed by melting and solidifying the Au—Sn layer; and thereby, the package 701 is formed.

Figure 11:
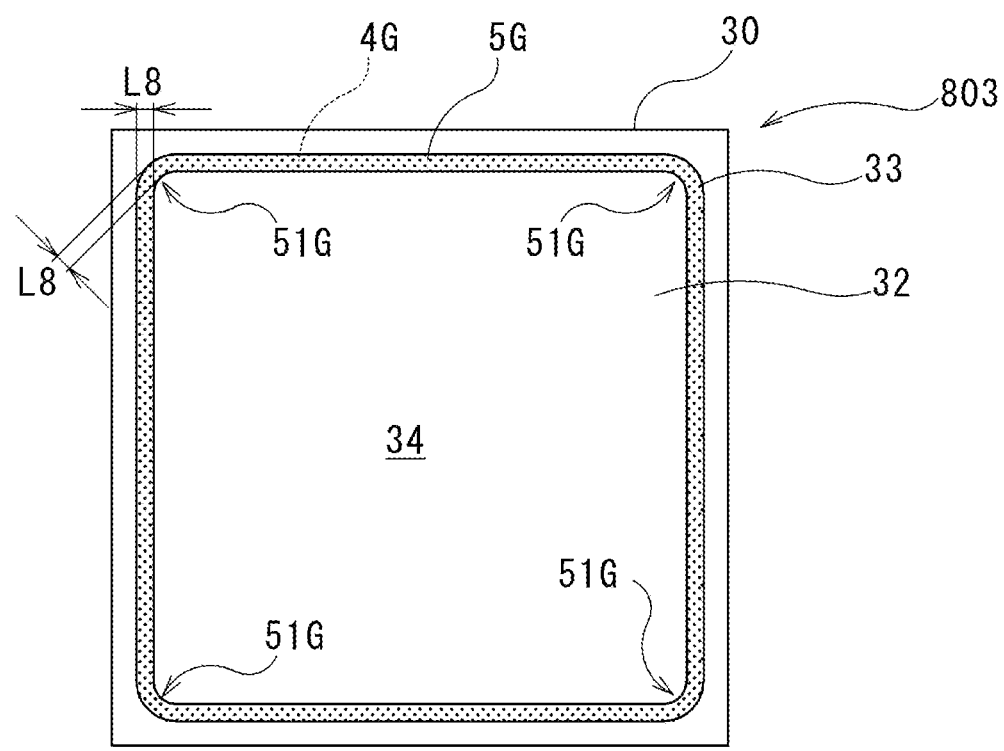
FIG. 11 is a plan view showing a surface to be bonded to the package substrate, in the lid material for packages of an eighth embodiment.

FIG. 11 is a plan view showing a lid material for packages 803 according to the eighth embodiment. In the eighth embodiment, a metallized layer 4G including arc-shaped corner portions is provided instead of the metallized layer 4 and an Au—Sn layer 5G including arc-shaped corner portions 51G is provided instead of the Au—Sn layer 5. The Au—Sn layer 5G is formed with the same (constant) width L8 as a whole including the corner portions 51G.

EXAMPLES

In the lid material for packages according to Examples 1 and 2 and Comparative Example 1, Au—Sn layers having different widths were formed on a plate-shaped glass member. A description will be given of the lid material for packages according to Examples 1 and 2 and Comparative Example 1. The width of the Au—Sn layer in each Example is shown in Table 1.

In each of Examples 1 and 2 and Comparative Example 1, the surface of a rectangular glass member of 20 mm×20 mm was subjected to Au plating to form 25 samples of metallized layers. The metallized layer had a rectangular frame shape having the same dimensions as the Au—Sn layer shown in Table 1, and had a thickness of 0.1 μm.

Au—Sn paste was coated on each metallized layer in the same rectangular frame shape as the metallized layer. The Au—Sn paste was obtained by mixing Au—Sn alloy powder and flux at a flux ratio of 10% by mass. The Au—Sn alloy powder (Au-22% by mass Sn alloy powder) included 22% by mass of Sn, and the remainder was Au and unavoidable impurities. An RA type was used as the flux.

Specifically, for Example 1 and the Comparative Example, in order to form an Au—Sn layer having a package size of 3030 (vertical length 3.0 mm×horizontal length 3.0 mm) having each dimension shown in Table 1 in the shape of the eighth embodiment shown in FIG. 11, Au—Sn paste was screen-printed and coated on a glass member using a printing mesh mask having a thickness of 30 μm.

In Example 2, in order to form an Au—Sn layer having a package size of 3030 (vertical length 3.0 mm×horizontal length 3.0 mm) having the dimensions shown in Table 1 in the shape of the second embodiment shown in FIG. 4, Au—Sn paste was screen-printed and coated on a glass member using a printing mesh mask having a thickness of 30 μm.

Then, the glass member coated with the Au—Sn paste was reflowed to form 25 frame-shaped Au—Sn layers on the glass member. In this reflowing, the coated film of Au—Sn paste was heated at 300° C. for one minute in an N2 atmosphere. In each Au—Sn layer formed in this manner, the width of the part (straight portion) excluding the corner portions and the maximum width of the corner portion were the values shown in Table 1, and the thickness of the Au—Sn layer was 4.7 μm.

For Examples 1 and 2 and Comparative Example 1, each of 25 samples of the Au—Sn layers obtained in this manner was observed, and the peeling from the glass member was evaluated according to the internal/external penetration rate of the Au—Sn layer.

(Peeling Evaluation: Internal/External Penetration Rate of Au—Sn Layer)

The Au—Sn layer formed on the metallized layer was observed from the upper surface with an optical microscope (at 10-fold magnification). A sample in which a portion continuously peeled from the outside of the Au—Sn layer to the inside of the Au—Sn layer was present was determined to be unacceptable. A sample in which no peeled portion was present was determined to be good. Then, in 25 samples of the Au—Sn layers formed on the glass member, the ratio of the number of samples determined to be good was calculated, and the value was shown in the item "Peeling Evaluation (%)" in Table 1.

TABLE 1

|  | Width of Au—Sn layer (μm) | | Peeling |
| --- | --- | --- | --- |
|  | Straight portion | Corner portion | Evaluation (%) |
| Example 1 | 225 | 225 | 92 |
| Example 2 | 225 | 100 | 96 |
| Comparative Example 1 | 425 | 425 | 48 |

In Examples 1 and 2 in which the width of the Au—Sn layer was 250 μm or less, the peeling evaluation was 92% or more. In particular, in Example 2 in which the width of the corner portion was 100 μm and was equal to or smaller than that of the straight portion, the peeling evaluation was 96% and the peeling evaluation was particularly high. On the other hand, in Comparative Example 1, since the width of the Au—Sn layer was 425 μm which was large, approximately half of the Au—Sn layers was peeled off and the peeling evaluation was 48% which was low.

Therefore, it was found that, when the width of the Au—Sn layer was 250 μm or less, it was possible to suppress peeling off of the Au—Sn layer. In addition, it was found that, when the width of the corner portion was smaller than the width of the straight portion, it was possible to further suppress the Au—Sn layer from being peeled off.

INDUSTRIAL APPLICABILITY

According to the present embodiment, the glass lid material for packages bonded to the package substrate is suppressed from being damaged, and the Au—Sn layer provided on the lid material for packages is suppressed from being peeled off. For this reason, it is possible to suitably apply the lid material for packages and the package of the present embodiment to a semiconductor device and a light emitting device in which a light emitting element such as a semiconductor laser (LD), an LED or the like is sealed in a package.

Explanation of Reference Signs
1, 701 Package
2, 702 Package substrate
6, 706 Bonding layer
21, 721, 731 Recess
22 Bonding surface
3, 103, 203, 303, 403, 503, 703, 803 Lid material for packages
4, 4G, 704 Metallized layer
5, 5A, 5B, 5C, 5F, 5G Au—Sn layer
51, 51A, 51B, 51C, 51E, 51G Corner portion
5D First Au—Sn layer
5E Second Au—Sn layer
30, 3F, 730 Glass member
Upper surface
32, 32F Lower surface
33, 533 Bonding portion
34, 534 Light transmitting portion

What is claimed is:

1. A lid material for packages which is bonded to a package substrate, the lid material comprising:
   a glass member including a bonding portion provided in a planar frame shape and a light transmitting portion provided inside the bonding portion,
   wherein the bonding portion includes: one or more metallized layers formed in a frame shape at the bonding portion of the glass member; and
   one or more Au—Sn layers in a state of being reflowed which are provided on the metallized layers and have a frame shape having a width of 250 μm or less.

2. The lid material for packages according to claim 1, wherein the frame shape of the one or more Au—Sn layers has one or more corner portions, and a maximum width of the corner portion is smaller than the width of the frame shape in a part excluding the corner portions of the Au—Sn layer.

3. The lid material for packages according to claim 2, wherein the corner portion is chamfered.

4. The lid material for packages according to claim 2, wherein the maximum width of the corner portion is 30 μm or more and 130 μm or less.

5. The lid material for packages according to claim 1, wherein the one or more Au—Sn layers are a first Au—Sn layer and a second Au—Sn layer provided inside the first Au—Sn layer with a gap therebetween.

6. The lid material for packages according to claim 1, wherein a thickness of the glass member is 50 μm or more and 3000 μm or less.

7. The lid material for packages according to claim 1, wherein the width of the Au—Sn layer is 50 μm or more.

8. The lid material for packages according to claim 1, wherein the width of the Au—Sn layer is 230 μm or less.

9. The lid material for packages according to claim 1, wherein the glass member has a flat plate shape.

10. The lid material for packages according to claim 1, wherein the glass member has a box shape.

11. A method for manufacturing a package, the method comprising:
   preparing at least one or more package substrates and the lid material for packages according to claim 1; and
   bringing the Au—Sn layer of the lid material for packages into contact with the package substrate, and melting and solidifying the Au—Sn layer; and thereby, bonding the lid material for packages and the package substrate.

* * * * *